United States Patent
Hamedi et al.

(10) Patent No.: US 8,017,218 B2
(45) Date of Patent: Sep. 13, 2011

(54) MICRO AND NANO STRUCTURES IN AN ELASTOMERIC MATERIAL

(75) Inventors: Mahiar Hamedi, Linkoping (SE); Kristofer Tvingstedt, Linkoping (SE); Peter Asberg, Linkoping (SE); Olle Inganas, Linkoping (SE)

(73) Assignee: Forskarpatent I Linkoping AB (SE)

( * ) Notice: Subject to any disclaimer, the term of this patent is extended or adjusted under 35 U.S.C. 154(b) by 557 days.

(21) Appl. No.: 11/908,763

(22) PCT Filed: Mar. 8, 2006

(86) PCT No.: PCT/SE2006/000304
§ 371 (c)(1),
(2), (4) Date: Oct. 6, 2008

(87) PCT Pub. No.: WO2006/096123
PCT Pub. Date: Sep. 14, 2006

(65) Prior Publication Data
US 2009/0053471 A1 Feb. 26, 2009

(30) Foreign Application Priority Data
Mar. 8, 2005 (SE) ...................... 0500548

(51) Int. Cl.
*B32B 3/00* (2006.01)
*G03F 7/00* (2006.01)
*B31F 1/07* (2006.01)
*G01N 1/10* (2006.01)

(52) U.S. Cl. ........ 428/156; 436/180; 430/296; 430/322; 264/485; 264/488; 264/494; 137/833; 101/3.1; 101/32

(58) Field of Classification Search ............... 428/156; 430/296, 320, 322; 264/405, 485, 488, 494; 101/3.1, 32; 435/305.2; 436/180; 137/833
See application file for complete search history.

(56) References Cited

U.S. PATENT DOCUMENTS

| | | | |
|---|---|---|---|
| 2002/0037499 A1* | 3/2002 | Quake et al. | 435/5 |
| 2002/0182241 A1* | 12/2002 | Borenstein et al. | 424/422 |
| 2004/0021254 A1* | 2/2004 | Sreenivasan et al. | 264/406 |

* cited by examiner

*Primary Examiner* — Donald J Loney
(74) *Attorney, Agent, or Firm* — Knobbe Martens Olson & Bear LLP

(57) ABSTRACT

The invention relates to an elastomeric device (105), wherein the elastomeric device contains a relief structure with indentations with respect to the base (110), (102) and wherein selected ones of said indentations comprise at least two indentation depths (112), (108) and indentation widths (101), (107). It also relates to a method of making a master for construction of said elastomeric device comprising a procedure to provide a pattern on a substrate of a suitable material. One step in. the construction of said elastomeric device comprises a molding procedure of an elastomer. Methods of using the elastomeric device in printing, fluidic control, sorting, lab-on-a-chip devices are also disclosed.

13 Claims, 7 Drawing Sheets

MICRO AND NANO STRUCTURES IN AN ELASTOMERIC MATERIAL

CROSS REFERENCE TO RELATED APPLICATIONS

This application claims priority to and is a U.S. National Phase filing of PCT International Application Number PCT/SE2006/000304, filed on Mar. 8, 2006, designating the United States of America and published in the English language, which claims priority under 35 U.S.C. §119 to Swedish Patent Application Number 0500548-3, filed on Mar. 8, 2005. The disclosures of the above-described applications are hereby expressly incorporated by reference in their entireties.

FIELD OF THE INVENTION

The present invention relates generally to soft lithographical patterning methods, and more specifically to generation of simultaneous and seamless supermicrometer and submicrometer structures in elastomeric materials. The present invention also relates to a method for construction of such structures in elastomeric materials.

BACKGROUND OF THE INVENTION

The development of nanotechnology requires efficient ways for fabrication of micron and submicron structures on the same substrate. In many applications, it is desired to fabricate micro and nano structures that are connected.

One of the advantages of connected micro-nano structures is that micron structures can easily be addressed electrically, optically and mechanically allowing further addressing of the nano structures. There is also a great need for mechanical micro-nano structures, interfaces, definers, bridges that can be used on both planar and non-planar substrates.

There are numerous materials with properties that are interesting at supermicrometer, micrometer and submicrometer sizes, but that can not be patterned using conventional lithographic methods. Soft lithography (SL) represents a non-photolithographic patterning method based on self assembly and replica molding for carrying out micro- and nanofabrication. In SL an elastomeric material with patterned relief structures on its surface is used to generate patterns and structures that can be in the range of 30 nm to several cm. [Younan xia and George m. Whitesides, soft lithography mater. sci. 1998. 28:153-84]

One of the limitations in SL is the softness of the elastomeric material, which limits the aspect ratio of relief structures Aspect ratio can be defined as the height h (FIG. 1; 108, 112) of the relief structure divided by the width w (FIG. 1; 101, 107) of the structure (h/w). When h/w is too low, the elastomeric material will deform/sag (See FIG. 6; 603/608). The sagging (608) of elastomers caused by compressive forces between the stamp and the substrate limits the use of most SL patterning techniques. The most common material used in SL is poly(dimethylsiloxane) (PDMS) which requires an aspect ratios >0.2 [Delamarche E, Schmid H, Biebuyck H A, Michel B. 1997. Adv. Mater. 9:741-46].

A number of prior arts for different techniques for patterning surfaces or materials deposited thereon without using conventional photolithography are known. An example of prior art is a paper by Zhang et al. [Zhang, L. G.; Liu, J. F. and Lu, Z. H. Micro fabrication on polymer with a contact procedure. *Supramolecular Science*, 5: 713-715 (1998)] discloses the fabrication of thickness-contrast micro-patterns based on a contact procedure. An array of PDMS micro-posts are constructed with grids which acts as the masters. This is also a contact procedure and the thickness-contrast micropatterns on the polymer can be replicated to other substrates, such as silicon wafers, with microcontact printing.

SUMMARY OF THE INVENTION

According to a first aspect of the invention, an elastomeric device comprises a body of an elastomeric material, said body having at least one, flat or curved, surface provided with a plurality of indentations extending into said at least one surface, wherein each indentation extends a depth h from a base line being a line where said surface intersects said indentation and wherein each indentation has at the base line a width w; said indentations forming relief structures on said surface, wherein the indentations of said relief structures have at least two different indentation depths, the indentations of said relief structures have at least two different indentation widths, an aspect ratio for a specific elastomeric material at a given position in the relief structures is defined as the ratio a=h/w of an indentation at that position, $a_{low}$ is the aspect ratio where sagging of the indentation occurs for said specific elastomeric material, $a_{high}$ is the aspect ratio where collapse of the indentation occurs for said specific elastomeric material, and said elastomeric device has an aspect ratio between $a_{low}$ and $a_{high}$.

A further aspect of the invention includes a method for providing a template for the construction of an elastomeric device, the method comprising arranging in a first process a surface of a template to contain a first inverse of one of submicrometer and said supermicrometer relief structures, and designing in a second process said surface of said template to contain a second inverse of the other one of said submicrometer and said supermicrometer relief structures arranged relative to said first inverse in a position equivalent to the relative positions of the corresponding said submicrometer and said supermicrometer relief structures of said device.

Still, a further aspect of the invention includes a method for manufacturing an elastomeric device, the method comprising depositing a curable and moldable elastomeric material on the surface of a template containing inverses of said submicrometer and said supermicrometer relief structures, curing said elastomeric material, and removing the elastomeric material from the template, wherein the elastomeric material after removal constitutes said device.

Still, a further aspect of the invention includes a method for manufacturing an elastomeric apparatus the method comprising providing a substrate having a face for receiving an elastomeric device, wherein said at least one surface of the elastomeric device including relief structures is brought into conformal contact with said face of the substrate.

Still, a further aspect of the invention is disclosed by presenting the apparatus provided by means of the preceding method.

In further aspects of the invention, the use of said device is presented for a number of purposes, including, for example, use as a lab-on-chip device, use in soft lithography, molding in capillaries (MIMIC), liquid printing, SAMIM, micro contact printing, and embossing. In some aspects, the use of said device can generate patterned deposits having etched protecting layers, which are in geometrical inverse to an original structure selected from the group consisting of silicon based materials, InGaSP based materials, and InP based materials.

The ongoing effort to reach and control any phenomena at the nano scale has been a major driving force for many scientific areas as well as for industrial commercially viable applications. This strive mainly originates due to that "smaller" generally means "faster". Smaller dimensions inherently give shorter timescales for most processes involved. The best example is of course the miniaturization of features in the computer processors that has boosted the operating frequency.

This invention is related to recent developments in soft elastomeric materials. Curable elastomers such as for example polydimethylsiloxane (PDMS) have the advantageous property of being able to replicate almost any structure at its transition from liquid to solid elastomer. Very small structures, even at the "large molecular" scale can be replicated by such elastomeric materials. The greatest benefit of elastomers is however the very low price and the very fast and easy processability. These elastic materials have now been available for a decade and have been extensively studied within the frames of "soft lithography" and several patterning techniques exploiting its property have been developed. Micro contact printing (μCP) and microfluidics in capillaries (MIMIC) are identified as some of the most commonly exploited techniques.

Until now, controlled structuring and utilization of the generated elastomeric features have been limited to either small or large structures, not simultaneous exploitation of the both. The controlled utilization of structures at the nano scale, or even submicrometer scale, is limited by the fact that they are so small. Micrometer precision will always be required to at all be able to access structures at the smaller nano dimension.

The invention is therefore related to the need for bridging the microscale and the nanoscale. Simultaneous and easy exploitation of structures at both the microscale and nanoscale has so far been hindered by large cost and relatively high time consumption. Elastomers and soft lithographic patterning techniques have here been identified as candidates for solving this problem in a cheap and easy way. The clear advantage of elasticity often emphasized in soft lithography, is however also an inherent limitation when it comes to working with features that are very different in size. The probability for material collapsing and sagging is high if considerations are not taken. The crucial limitations of elastomeric materials are therefore identified and solved with the introduction of a material dependent "dynamic working range". By always maintaining any aspect ratio of any elastomer structure within the dynamic working range, any possibility for simultaneous exploitation of both micro structures and nano structures is open.

Further, a method for generating such structured elastomers (FIG. 3; 312) with very different relief feature sizes (FIG. 3; 302, 305, 306, 307, 313, 314, 315) at the larger microscale and the smaller nanoscale is included in the invention.

The invention can hence best be described as a versatile platform for bridging the micro and the nanoscale by exploiting elastomeric materials and its advantageous processing conditions. A simple embodiment of the invention is therefore "an elastomeric device (sometimes referred to as a stamp), (FIG. 1; 105) that incorporates both micro (109) and nano scaled (103) features that satisfy the "dynamic working range" of the material.

Examples of potential applications of the invention are therefore many such as micro to nano fluidic networks (FIG. 5; 502) for molecular separation and sorting and controlled fluidic material deposition at the micro to nano scale.

DETAILED DESCRIPTION OF THE INVENTION

A number of embodiments will be described below supported by means of the attached drawings.

Figure 4:
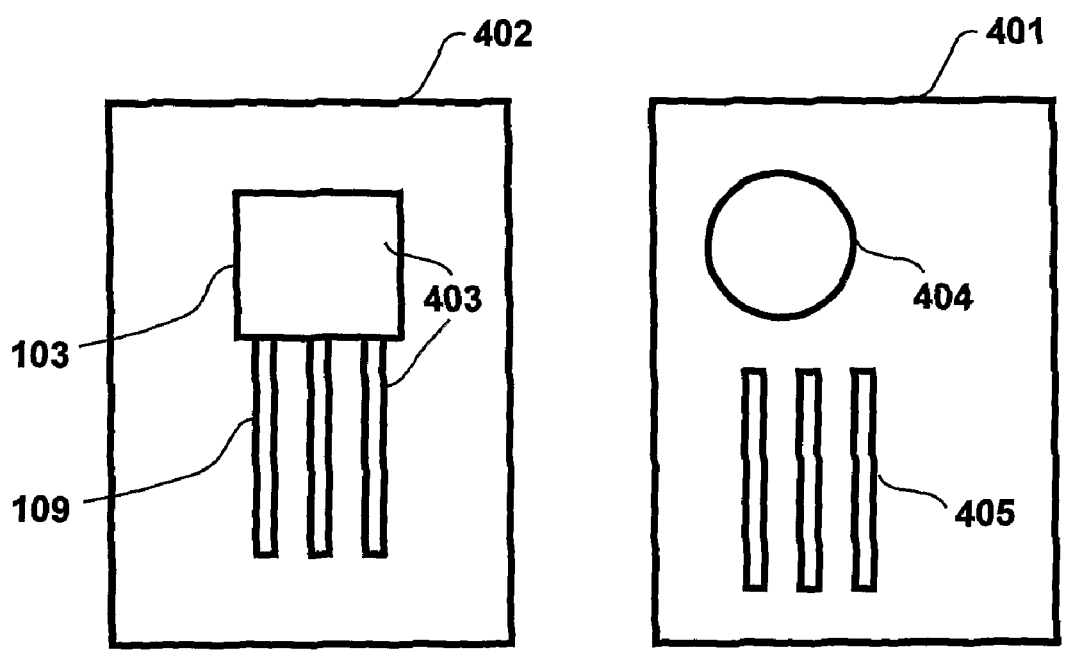
FIG. 4, is an illustration of a top view of different embodiments of the elastomeric device showing connected and unconnected relief structures with different widths and heights.

In general terms, the present invention relates to a novel elastomeric device 105 for use in, as examples, submicrometer 103 and supermicrometer 109 structures in a connected embodiment 402 and an unconnected embodiment 401 as shown in FIG. 4, thus achieving micro to nano interfaces, pattern generating methods or sub-micrometer and super-micrometer aligning methods.

The term supermicrometer shall be taken to mean any dimension that is larger than micrometer in feature size. Supermicrometer dimension can also be referred to as microscale.

The term submicrometer shall be taken to mean any dimension that is smaller than 1 micrometer in feature size, i.e. dimensions ranging from 0.1 nanometer up to 1 micrometer, preferred range is between 1 nanometer and 100 nanometer. Submicrometer dimension can also be referred to as nano dimensions, or nanoscale.

For the purpose of this application, the term "elastomer" or "elastomeric material" shall be taken to mean any moldable and curable material that can contain a relief structure and has a dynamic working range, as explained below. Elastomeric material and elastomer can be materials such as PDMS, hPDMS, polyurethane, rubber, gels, hydrogels, mixture in hydrocarbon oils, polymers containing plasticizers or possible combinations thereof. Table 1 and Table 2 list some more elastomeric materials. Elastomeric materials belong to the class of soft materials and have the possibility to conform to both planar and non-planar surfaces. Furthermore elastomeric materials are capable of replicating structures of dimensions in the submicrometer regime, which makes them suitable for application in the fields of nano technology.

The term "elastomeric device" shall be taken to mean any elastomeric material having a relief structure according to the first aspect of the present invention. The uses for said elastomeric device are numerous and includes soft lithography, fluidics, separation, sorting, lab-on-a-chip devices, as part of larger instruments, as part in hand hold instruments, imprinting devices, patterning devices and more.

In the description of the invention the term "base" 102, 110, 301 shall be taken to mean a line along a surface of a body of the elastomeric device from which an indentation 10, 11 penetrates into said body. Said base line intersects contact points between said surface and the border of the indentation at the surface. This second statement can be applied also for a curved surface of the body of the device.

"Indentation width" 107, 101 as the term is used herein, shall be taken to mean the width of indentation in the elastomeric device at the base, and that defines the feature size of the relief structures in the elastomeric device.

"Indentation depth" 108, 112 as the term is used herein, shall be taken to mean the depth of the indentation with respect to the base in the elastomeric device.

Soft lithography (SL) represents a non-photolithographic patterning method based on self assembly and replica molding for carrying out micro- and nanofabrication. In soft lithography an elastomeric material, such as the elastomeric device in the disclosed invention, with patterned relief structures on its surface is used to generate patterns and structures that today can be in the range of 1 nano meter and up to several cm. [Younan Xia and George M. Whitesides, soft lithography Mater. Sci. 1998. 28:153-84]. Soft lithography is therefore one of the major areas of application for the disclosed invention, where soft lithographical methods such as molding in capillaries, contact printing, SAMIM, and embossing can be performed using the disclosed elastomeric device. Elastomeric materials can also be used in other applications than soft lithography, such as in applications for fluidic network. A fluidic network with precisely defined structures in both super-micrometer and sub-micrometer domain in the same material is crucial for the construction of high precision devices combined with an attractive price. The present invention provides a solution to this and for the first time it is possible to combine larger storage compartments, a microfluidic network and nanometer sized structures in the same elastomeric device. Some advantages of using a selected elastomer is the moldable and curing properties making it possible to mass produce these elastomeric devices. The property of an elastomeric device 202 to be able to conform to a substrate 203 with both planar and non-planar (curved) shape can be an advantage in many cases. All this is possible to combine with nanometer sized structures and larger structures, whereupon the advantages are obvious. The elastomeric device disclosed in the present invention can be used as a part in a larger system including lab-on-a-chip devices, cell manipulation devices, devices for fluidic sorting and separation of biomolecules or other macromolecules, imprinting devices.

The obvious limitation of elastomeric materials used in SL patterning or other applications where the stamp if put in contact with a face 201 of a substrate 203 of other materials, is the sagging 608 or collapse 603 of the elastomers due to inappropriate aspect ratios.

Figure 6:
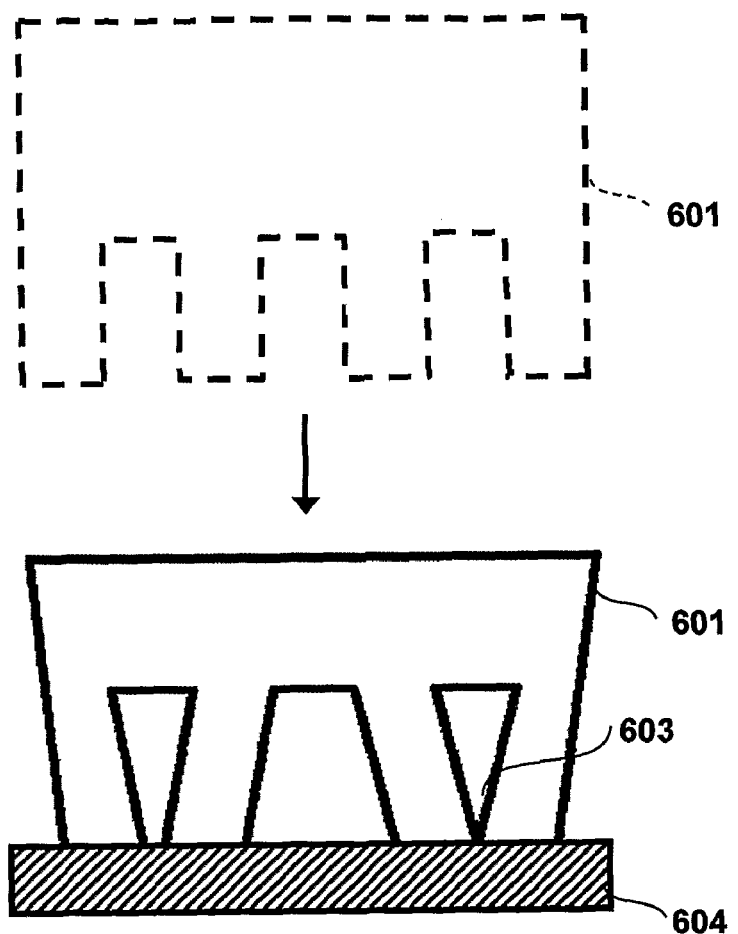
FIG. 6, is a cross sectional view of embodiments of an elastomeric apparatus, illustrating sagging and pairing (collapsing) of the elastomeric device (stamp) when put in conformal contact with a substrate.
Figure 6:
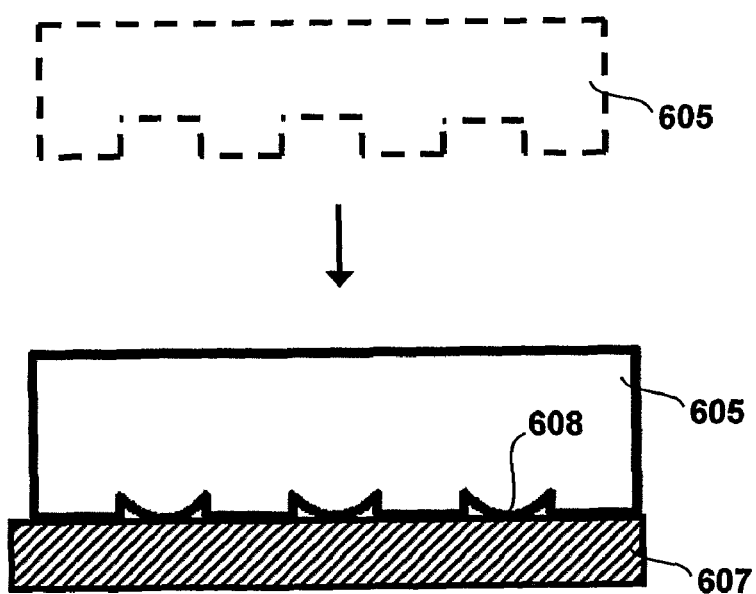
Figure 7:
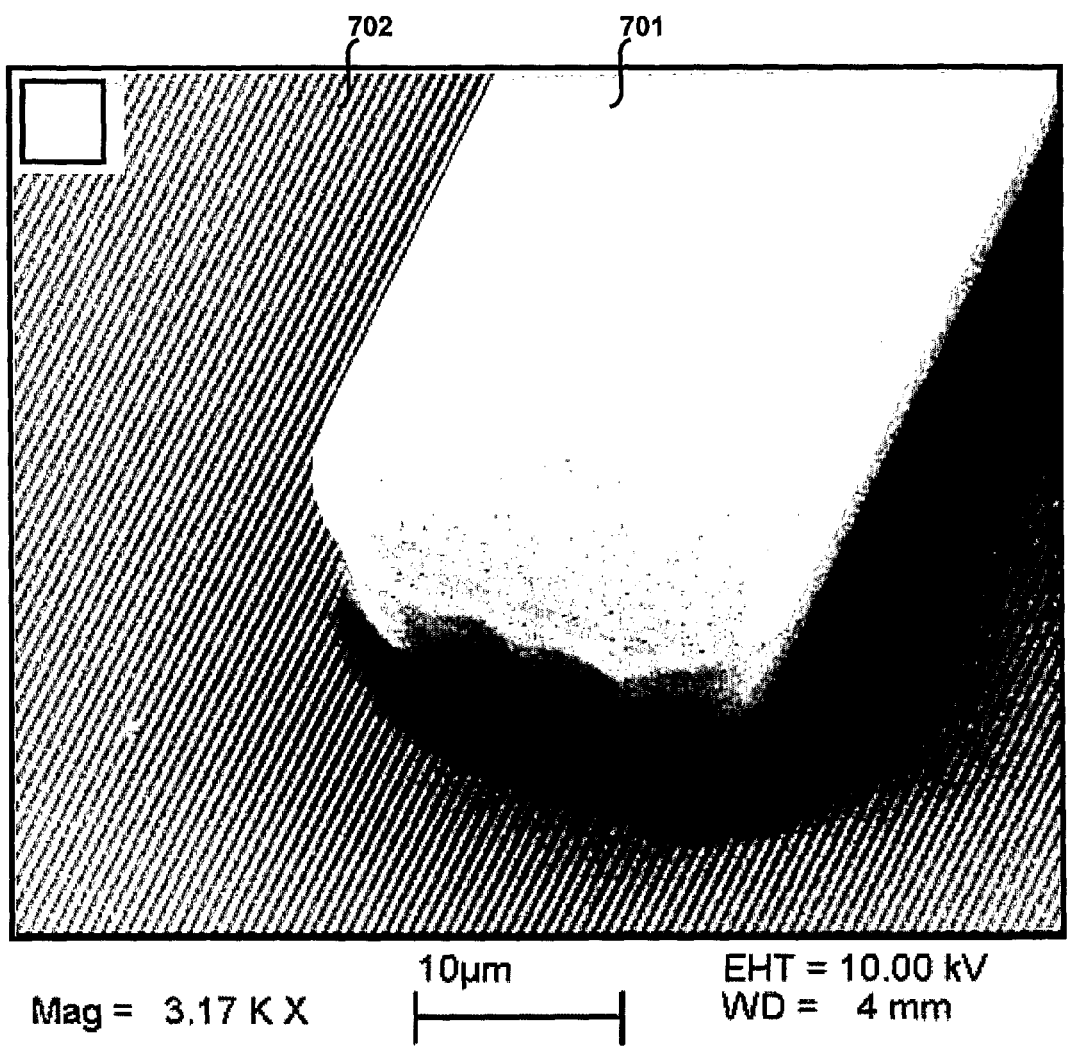
FIG. 7, is a scanning electron microscopy (SEM) perspective picture of one embodiment of a template structure containing connected micrometer and submicrometer line structures created in the photo resist SU-8 and as such being an example from the reality of the schematic disclosure of the same device as drawn in FIG. 1.

The aspect ratio a at a given position in the relief structure is defined as the ratio of the indentation depth h 108, 112 at that given position to the indentation width w 107,101 (a=h/w) at that given position in the elastomeric device 105. If the aspect ratio a is too small, the elastomeric material no longer withstands the compressive forces caused by adhesion between the elastomeric device, as shown in FIG. 6 (601, 605) and the corresponding substrates (604, 607). These forces cause sagging 608 of the elastomeric material, whereupon sagging occurs, which implies that the innermost parts of an indentation of the stamp that are normally not located at the base are bent down to the same level as the base (referred to as base line 301 in FIG. 3) and abut or become attached to the substrate. A lower limit of the aspect ratio a for which sagging occurs for that particular elastomeric material is defined as $a_{low}$.

If the indentation depth of the structure is too large, the elastomeric material will collapse 603 under its own weight, whereupon collapsing parts of the indentations bend inwards and attach to each other. The collapsing of an elastomeric material defines an upper limit for the aspect ratio $a_{high}$ for that material.

The lower and upper limits of the aspect ratio for an elastomeric material together define a dynamic working range $d=a_{high}/a_{low}$ for that elastomeric material.

The most common way to create elastomeric materials is by replica molding from a hard master template. Such templates are often created with single step lithographic technologies such as UV or EUV photo lithography, or e-beam lithography. Single step techniques however allow only a constant thickness or height for all the structures on the master template, resulting in a constant indentation depth in the replicated elastomeric material. Assuming constant indentation depth of relief structures in an elastomeric material, the dynamic range for the indentation width dw=largest indentation width/smallest indentation width will be equal to the dynamic working range, i.e. dw=d, for that material.

As an example the most common elastomeric material PDMS has an approximate dynamic working range d=10. This means that it is possible to use relief structures with a dynamic range in indentation width of the same value dw=10.

Assuming that the smallest indentation width would be 100 nm in a relief structure in PDMS with constant indentation depth, then the maximum indentation width would be 100 nm*d=1000 nm=1 µm. Structures that are larger than 1 micrometer would thus sag.

Figure 3:
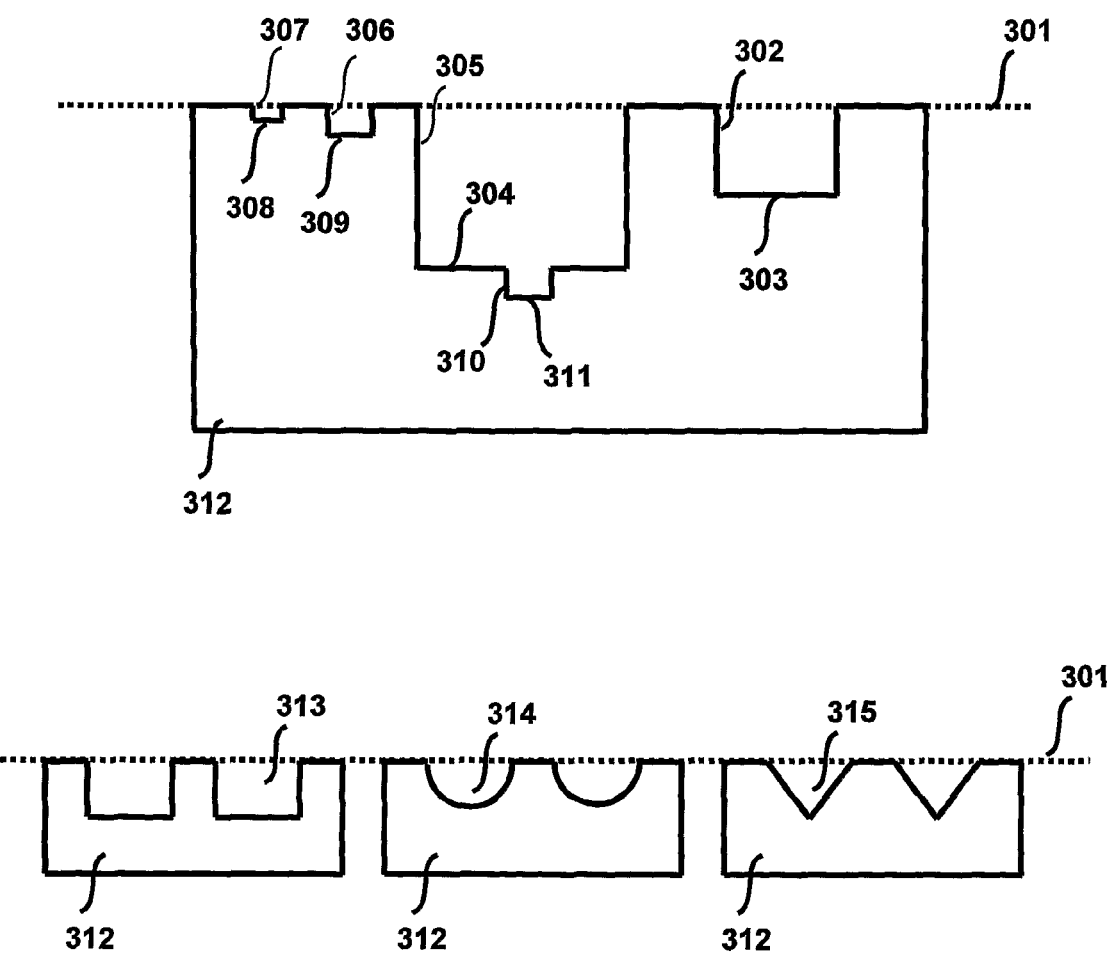
FIG. 3, is a cross sectional view of one embodiments of an elastomeric device illustrating indentations with different heights and widths.

This example illustrates the difficulty of using PDMS with the same indentation depth for both submicron and super micron structures. Another example is the elastomeric material hard PDMS that has a dynamic working range d~10*3=30 allowing an indentation width for example in the range of 30 nm up to 30 nm*30=900 nm with the same indentation depth. The sagging of elastomeric materials is therefore of great disadvantage if one wishes to create relief structures with a high difference in indentation width. The solution to this problem is to have different indentation depths 302, 305, 306, 307, 310 for different ranges of indentation widths 303, 304, 309, 308, 311 for the disclosed elastomeric device. FIG. 3 further illustrates that the cross sectional area of the indentations immersing into the body 312 of an elastomeric device can have different types of geometrical cross sections, such as rectangular 313, a curved inner contour 314, triangular 315.

Using the elastomeric device of the present invention it is possible to construct connected supermicrometer to submicrometer structures. Such an elastomeric device could be used in applications such as fluidics, nerve interfaces, separation devices, a new type of aligning device for soft lithography, etc.

Figure 1:
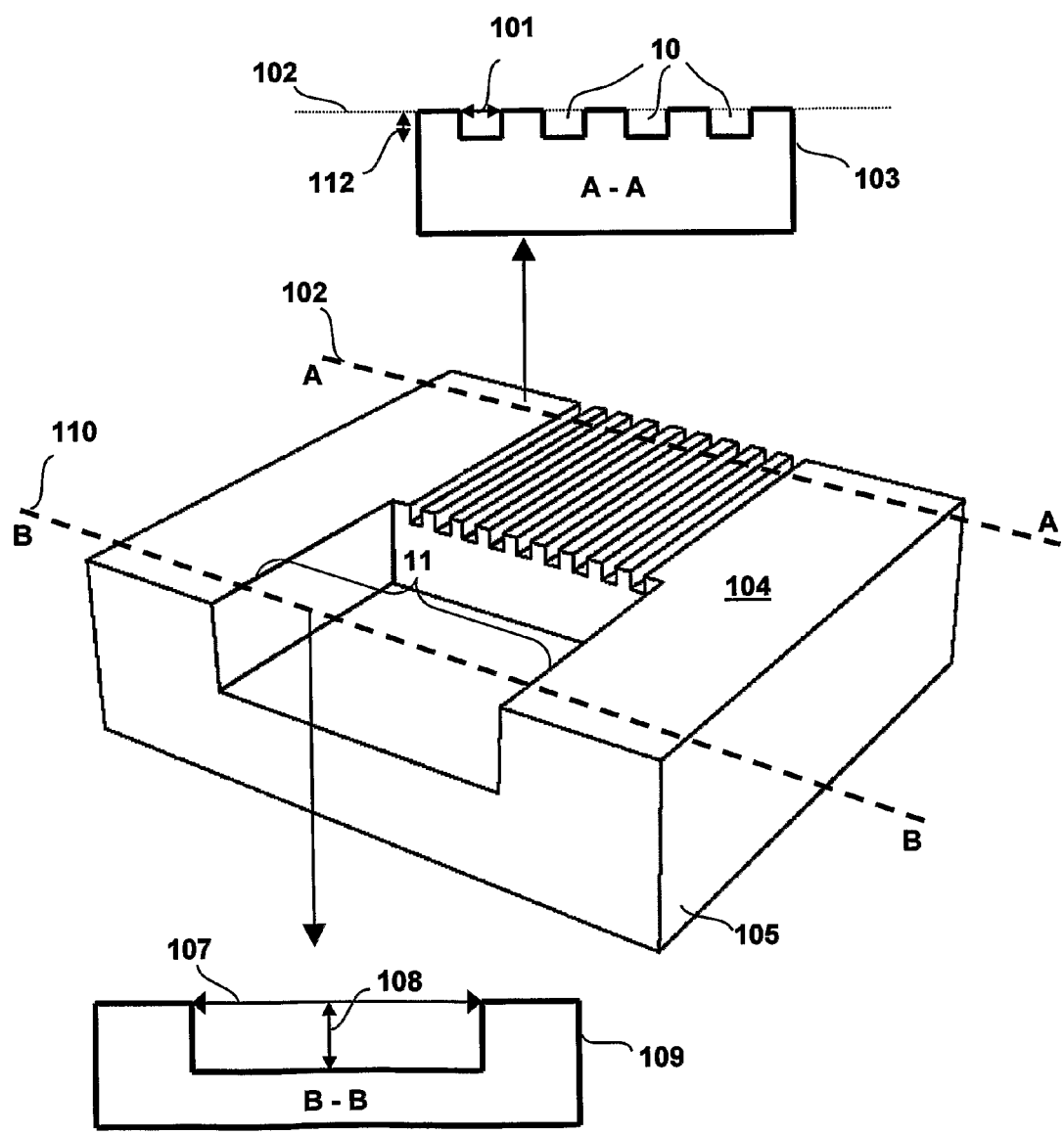
FIG. 1, is a perspective drawing of one embodiment of an elastomeric device containing connected indentations with different depths and widths. The upper part shows a cross section of the device along the line A-A and the bottom part shows a cross section of the device along the line B-B.

The first aspect of the present invention relates to relief structures in moldable and curable elastomeric materials with at least two different indentation depths 108, 112 with respect to the base 102, 110 as shown in FIG. 1. The indentation widths 107, 101 of such relief structures could be of both submicrometer and supermicrometer dimensions.

The submicrometer 103 structures and supermicrometer 109 structures are designed so that all the aspect ratios are within the dynamic working range d for the particular elastomeric material. Submicrometer 103 and supermicrometer 109 structures on the elastomeric material 401, 402 can be found on arbitrary regions and have arbitrary shapes such as 405, 404, 403 of FIG. 4, where 404 and 405 refer to either a submicrometer 103 or a supermicrometer 109 structure. A submicrometer 103 and a supermicrometer 109 structure can be connected with each other as exemplified by the relief structure 403, or un-connected/separated from each other, exemplified by 404, 405.

Figure 2:
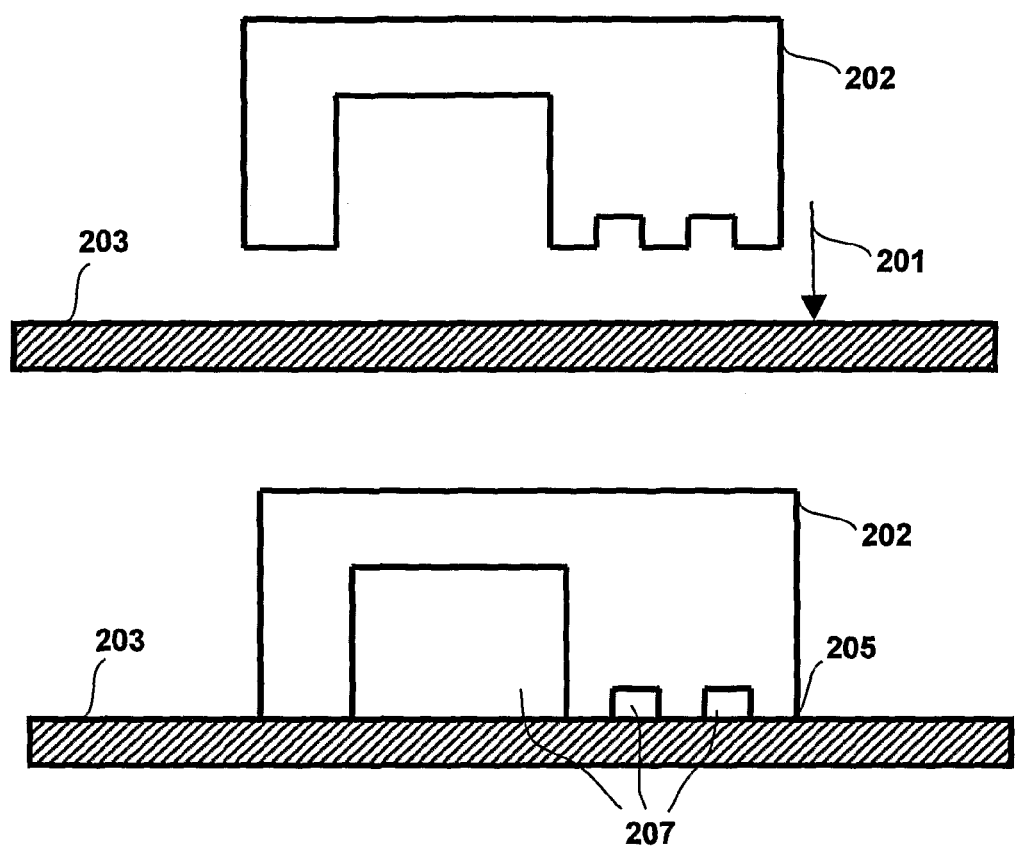
FIG. 2, is a cross sectional view of one embodiment of an elastomeric device and a substrate, illustrating putting the elastomeric device in conformal contact with the substrate for forming an elastomeric apparatus.

In a further aspect of the present invention the elastomeric device containing a relief structure described in the first aspect of the invention is placed on a face 201 of a solid support, a substrate 203. A conformal contact 205 is achieved between the stamp and the substrate 203 that can be planar or non-planar. The relief structures with different depths can be connected, such as in fluidic device 502 formed on a substrate 501. In such devices the relief structure in the elastomeric device 105 are such that the indentations of the relief structure form enclosed channels 207 together with (in cooperation) with the face 201 of the substrate 203 (as shown in FIG. 2), so that the channels 207 can be in both supermicrometer 103 and submicrometer 109 dimension and seamlessly connected to each other. The enclosed channels can then carry fluids moving continuously between submicrometer 505, 504 to supermicrometer 503, 506, 507 channels.

In other examples the relief structures with different depths can be unconnected and parts of the supermicrometer structure 404 can then be used together with micrometer structures on a substrate 203 for the purpose of positioning/alignment of structures to the substrate.

In general, the disclosed elastomeric stamp can together with a substrate be used for all patterning techniques in soft lithography as described previously.

A further aspect of the present invention relates to a method for the construction of solid structures that can be used as templates for the creation of elastomeric devices containing connected or unconnected submicrometer and supermicrometer structures described in the first aspect of the invention. A template can be constructed in a hard material, and used for mass production of the elastomeric device by repeated elastomer molding from the template. Standard patterning methods only allow for the construction of template structures in one height, which is not enough for the construction of the elastomeric device in the present invention.

A method for providing a template for the construction of the elastomeric device according to the first aspect of the invention includes:
  arranging in a first process a surface of said template to contain a first inverse of one of said submicrometer (103) and said supermicrometer (109) relief structures, and
  designing in a second process said surface of said template to contain a second inverse of the other one of said submicrometer (103) and said supermicrometer (109) relief structures arranged relative to said first inverse in a position equivalent to the relative positions of the corresponding said submicrometer (103) and said supermicrometer (109) relief structures of said device.

Furthermore, standard nano patterning technologies, such as e-beam, or nano imprint lithography do not allow a large in plane aspect ratio, and it is difficult to construct structures in both submicrometer and supermicrometer feature size, with one patterning method. A solution for the construction of a solid structures/templates is therefore the combination of several patterning techniques in hard materials in order to achieve structures in both supermicrometer and submicrometer domains and with different heights.

The most common way to create supermicrometer structures is photo lithography; however other techniques such as soft lithography could also be used for the creation of supermicrometer structures. Submicrometer patterning techniques include e-beam or ion-beam lithography and Nano Imprint lithography.

Supermicrometer techniques and submicrometer patterning techniques can then be combined in preferred order for the creation of hard templates where the supermicrometer and submicrometer structures have different heights.

The two different techniques must be chosen so that their combination is possible. For example if the submicrometer structures is patterned in a resist, and another resist is chosen for the patterning of the micro structure, then both resists should adhere to each other, and the micro resist should not dissolve or destroy the sub micro resist during photo patterning and etching.

Since the submicrometer and supermicrometer structures are combined, they can be made to have different heights. Different heights for different structure width in the hard template then lead to different indentation depth for different indentation widths in the replicated elastomeric material. Choosing appropriate heights thus allows for all the structures in the elastomeric material to be inside a dynamic working range.

Tables

TABLE 1

Examples of elastomers included in the present invention.

| TDS/Product | Polymer family | Supplier |
| --- | --- | --- |
| Oppanol ® B 10 | Rubber - Elastomer >> Polyisobutylene, PIB | BASF |
| Pergut ® S 10 | Rubber - Elastomer >> Chlorinated rubber/Chloroprene, CR | Bayer |
| Pergut ® S 170 | Rubber - Elastomer >> Chlorinated rubber/Chloroprene, CR | Bayer |
| Therban ® XT VP KA 8889 | Rubber - Elastomer >> Butadiene-acrylonitrile/Nitrile rubber, NBR | Bayer |
| Trilene ® 65 | Rubber - Elastomer >> Ethylene-propylene diene terpolymer, EPDM | Crompton-Uniroyal Chemical |
| Trilene ® 67 | Rubber - Elastomer >> Ethylene-propylene diene terpolymer, EPDM | Crompton-Uniroyal Chemical |

TABLE 1-continued

Examples of elastomers included in the present invention.

| TDS/Product | Polymer family | Supplier |
|---|---|---|
| Versalloy ® XL 9045X-1 | Rubber - Elastomer | DSM-GLS |
| Hypalon ® 40 | Rubber - Elastomer >> Chlorinated rubber/Chloroprene, CR | Dupont Dow Elastomers |
| Hypalon ® 4085 | Rubber - Elastomer >> Chlorinated rubber/Chloroprene, CR | Dupont Dow Elastomers |
| Hypalon ® 40S | Rubber - Elastomer >> Chlorinated rubber/Chloroprene, CR | Dupont Dow Elastomers |
| Hypalon ® 45 | Rubber - Elastomer >> Chlorinated rubber/Chloroprene, CR | Dupont Dow Elastomers |
| Isolene ® 40-S | Rubber - Elastomer >> Polyisoprene rubber, IR | Elementis |
| Chemigum ® P615-D | Rubber - Elastomer >> Butadiene-acrylonitrile/Nitrile rubber, NBR | Eliokem |
| Exxon Bromobutyl ® 2211 | Rubber - Elastomer >> Butyl rubber, IIR | ExxonMobil Chemical |
| Exxon Butyl ® 007 | Rubber - Elastomer >> Butyl rubber, IIR | ExxonMobil Chemical |
| Exxon Butyl ® 077 | Rubber - Elastomer >> Butyl rubber, IIR | ExxonMobil Chemical |
| Alcryn ® MPR 1060KB | Rubber - Elastomer | Ferro-APA |
| Alcryn ® MPR 3055NC | Rubber - Elastomer | Ferro-APA |
| Versaflex ™ CL30 | Rubber - Elastomer | GLS |
| G&E ™ Blended Chlorobutyl | Rubber - Elastomer >> Chlorinated rubber/Chloroprene, CR | Goldsmith & Eggleton |
| Keywax 6-35 M | Rubber - Elastomer >> Butyl rubber, IIR | Key Polymer |
| Hycar ® ATBN 1300X16 | Rubber - Elastomer >> Butadiene-acrylonitrile/Nitrile rubber, NBR | Noveon |
| Hycar ® ATBN 1300X21 | Rubber - Elastomer >> Butadiene-acrylonitrile/Nitrile rubber, NBR | Noveon |
| CR- 1 | Rubber - Elastomer >> Chlorinated rubber/Chloroprene, CR | Petrochemicals |
| NRB- 1 | Rubber - Elastomer >> Butadiene-acrylonitrile/Nitrile rubber, NBR | Petrochemicals |
| Butaclor ® MC 30 | Rubber - Elastomer >> Chlorinated rubber/Chloroprene, CR | Polimeri Europa |
| Butaclor ® MH 30 | Rubber - Elastomer >> Chlorinated rubber/Chloroprene, CR | Polimeri Europa |
| Chlorub 40 | Rubber - Elastomer >> Chlorinated rubber/Chloroprene, CR | Rishiroop |
| Krasol LB2000 | Rubber - Elastomer >> Polybutadienes, Liquid Hydroxyl-Terminated | Sartomer |
| Krasol LB3000 | Rubber - Elastomer >> Polybutadienes, Liquid Hydroxyl-Terminated | Sartomer |
| Krasol LB5000 | Rubber - Elastomer >> Polybutadienes, Liquid Hydroxyl-Terminated | Sartomer |
| Krasol LBH-P2000 | Rubber - Elastomer >> Polybutadienes, Liquid Hydroxyl-Terminated | Sartomer |
| Poly bd 600E | Rubber - Elastomer >> Polybutadienes, Liquid Hydroxyl-Terminated | Sartomer |
| Ricacryl 3500 | Rubber - Elastomer >> Polybutadiene Rubber | Sartomer |
| Sifel ® 604 | Rubber - Elastomer >> Silicone rubber | Shin-Etsu |
| Skyprene ® Y-30 | Rubber - Elastomer >> Chlorinated rubber/Chloroprene, CR | Tosoh |
| Hydrin ® H45 | Rubber - Elastomer >> Epichlorohydrin rubber, CO, ECO, GCO, GECO | Zeon Chemical |
| Hydrin ® H55 | Rubber - Elastomer >> Epichlorohydrin rubber, CO, ECO, GCO, GECO | Zeon Chemical |
| Hydrin ® H65 | Rubber - Elastomer >> Epichlorohydrin rubber, CO, ECO, GCO, GECO | Zeon Chemical |

TABLE 1-continued

Examples of elastomers included in the present invention.

| TDS/Product | Polymer family | Supplier |
| --- | --- | --- |
| Hydrin ® H75 | Rubber - Elastomer >> Epichlorohydrin rubber, CO, ECO, GCO, GECO | Zeon Chemical |
| Nipol ® 1000X132 | Rubber - Elastomer >> Butadiene-acrylonitrile/Nitrile rubber, NBR | Zeon Chemical |
| Nipol ® 1072 | Rubber - Elastomer >> Butadiene-acrylonitrile/Nitrile rubber, NBR | Zeon Chemical |
| Nipol ® AR12 | Rubber - Elastomer >> Polyacrylic Rubber | Zeon Chemical |
| Nipol ® HR662 | Rubber - Elastomer >> Butadiene-acrylonitrile/Nitrile rubber, NBR | Zeon Chemical |
| Nipol ® HR665 | Rubber - Elastomer >> Butadiene-acrylonitrile/Nitrile rubber, NBR | Zeon Chemical |
| Nipol ® NX775 | Rubber - Elastomer >> Butadiene-acrylonitrile/Nitrile rubber, NBR | Zeon Chemical |
| Zetpol ® 0020 | Rubber - Elastomer >> Hydrogenated Acrylonitrile-Butadiene Rubber | Zeon Chemical |
| Zetpol ® 1000L | Rubber - Elastomer >> Hydrogenated Acrylonitrile-Butadiene Rubber | Zeon Chemical |

TABLE 2

Some examples of Sylgard (Dow Corning Corp. USA) elastomers and their special properties.

| Product | Special properties |
| --- | --- |
| SYLGARD ® 3-6605 THERMAL CONDUCTIVE ELASTOMER | Good flowability; Room-temperature or fast thermal cure; resist humidity and other harsh environments; good dielectric properties; self-priming adhesion; low stress |
| SYLGARD ® Q3-3600 THERMALLY CONDUCTIVE ENCAPSULANT | Rapid heat cure; long pot life; excellent flow; self-priming; UL 94 V-1 rating; Room-temperature or fast thermal cure; resist humidity and other harsh environments; good dielectric properties; self-priming adhesion; low stress |
| SYLGARD HIGH VOLTAGE INSULATOR COATING | These are designed to reduce arcing, tracking and flashovers to improve your system reliability and lower maintenance costs. |
| SYLGARD ® 1-4128 CONFORMAL COATING KIT | Solventless, one-part, non-corrosive, moisture-curing, RTV silicone elastomers; most are fast cure; Translucent liquids; available in different viscosities |
| SYLGARD ® 160 SILICONE ELASTOMER KIT | Low cost; good thermal conductivity Two part; 10:1 mix; minimal shrinkage; no exotherm during cure; no solvents or cure byproducts; deep section cure; repairable; good dielectric properties; flexible elastomer |
| SYLGARD ® 164 SILICONE ELASTOMER KIT | Fast cure; low cost; good thermal conductivity Two part; 10:1 mix; minimal shrinkage; no exotherm during cure; no solvents or cure byproducts; deep section cure; repairable; good dielectric properties; flexible elastomer |
| SYLGARD ® 170 FAST CURE SILICONE ELASTOMER KIT | Low viscosity Two part; 10:1 mix; minimal shrinkage; no exotherm during cure; no solvents or cure byproducts; deep section cure; repairable; good dielectric properties; flexible elastomer |
| SYLGARD ® 170 SILICONE ELASTOMER KIT | Fast cure; low viscosity Two part; 10:1 mix; minimal shrinkage; no exotherm during cure; no solvents or cure byproducts; deep section cure; repairable; good dielectric properties; flexible elastomer |
| SYLGARD ® 182 SILICONE ELASTOMER KIT | Transparent; long pot life; heat cure Two part; 1:1 mix; heat cure; minimal shrinkage; no exotherm during cure; no solvents or cure byproducts; repairable; good dielectric properties |
| SYLGARD ® 184 SILICONE ELASTOMER KIT | Transparent; RT/HA cure Two part; 1:1 mix; heat cure; minimal shrinkage; no exotherm during cure; no solvents or cure byproducts; repairable; good dielectric properties |
| SYLGARD ® 186 SILICONE ELASTOMER KIT | Clear; RT/HA cure; high tear strength Two part; 1:1 mix; heat cure; minimal shrinkage; no exotherm during cure; no solvents or cure byproducts; repairable; good dielectric properties |
| SYLGARD ® 3-6636 SILICONE DIELECTRIC GEL KIT | Extremely soft or firm, thermal/mechanical shock and vibration damping, excellent dielectric properties, flexible cure schedule, Two-part, RT/heat cure, clear, high viscosity |
| SYLGARD ® 527 A&B SILICONE DIELECTRIC GEL | Two-part, room temperature (RT) or heat cure, clear or red |

TABLE 2-continued

Some examples of Sylgard (Dow Corning Corp. USA) elastomers and their special properties.

| Product | Special properties |
|---|---|
| SYLGARD ® 528 FIRM GEL PARTS A&B | Firm or tough, thermal/mechanical shock and vibration damping, primerless chemical adhesion at room temperature, Two-part, heat cure, clear, firm gel |
| SYLGARD ® 535 THIXOTROPIC DIELECTRIC GEL | Extremely soft or firm, thermal/mechanical shock and vibration damping, excellent dielectric properties, flexible cure schedule, reversion resistant, thick section cure, compatible with automated dispensing equipment, and physical and electrical stability over a wide temperature range (−45 to 150° C./−49 to 302° F.), One-part, translucent, heat cure thixotropic gel |
| SYLGARD ® 537 ONE PART DIELECTRIC GEL | One-part, clear, low viscosity gel |
| SYLGARD ® 567 PRIMERLESS SILICONE ENCAPSULANT KIT | Two part; 1:1 mix; heat cure; minimal shrinkage; no exotherm during cure; no solvents or cure byproducts; repairable; good dielectric properties; Heat cure; unprimed adhesion; elastomeric |
| SYLGARD ® 577 PRIMERLESS SILICONE ADHESIVE KIT | Noncorrosive; rapid heat cure; self-priming; high strength; UL 94V-0; MIL-PRF-23586F |
| SYLGARD ® HVIC+ | Water repellant |

EXAMPLES

Example

A Micro Nano Hard Template Construction Method for the Construction of Supermicrometer Structures on Submicrometer Structures Comprising the Following Two Construction Steps:
First Steps:
(1) A solid and plane support, a substrate, including, but not limited to, silicon wafers, glass (e.g. glass slides, glass beads, glass wafers etc.), polystyrene, polyethylene, gold, indium tin oxide (ITO coated materials, e.g. glass or plastics), is provided;
(2) A moldable and curable photoresist such as SU-8 (MicroChem Corp., MA, USA), PMMA resists (MicroChem Corp., MA, USA), Microposit S1813 (Shipley Corp., USA), Microposit S1818 (Shipley Corp., USA) is provided
(3) A nano mold containing submicrometer structure in a hard material or elastomeric material that allows curing of the photoresist situated below said mold.
(4) A sub-micrometer structure is created on the solid support (1). A small amount of photoresist (2) is placed on the substrate and the nano mold (3) is pressed against the small amount of photoresist with appropriate pressure, this step is called nano imprint imprint lithography. Then combined with curing of the photoresist, by for example UV-light, located between the substrate (1) and the sub-micrometer mold (3) the sub-micrometer structure is defined.
(5) An alternative to steps (1)-(4) is to provide a substrate such as a silicon wafer, glass slide containing a sub-micrometer pattern created by some other method such as, but not limited to, electron beam lithography, deep UV photolithography, ion beam patterning, soft UV-nano imprint lithography, nano imprint lithography, soft lithography, self assembly patterning, colloidal crystal patterning.
Second Step:
(6) A photoresist is provided with such properties that it adheres to the chosen substrate and/or the submicrometer structure material.
(7) The photo resist is coated over the entire substrate so that the sub-micrometer structure is totally covered or over a part of the substrate and/or part of the nanostructure.
(8) The photo resist is patterned with micro patterns using conventional techniques, such as contact photolithography, proximity photolithography, screen printing, soft lithography, imprinting. The micro resist is aligned against the sub micro resist prior to patterning, using for example alignment marks.

Example 1

Molding of Template

Figure 5:
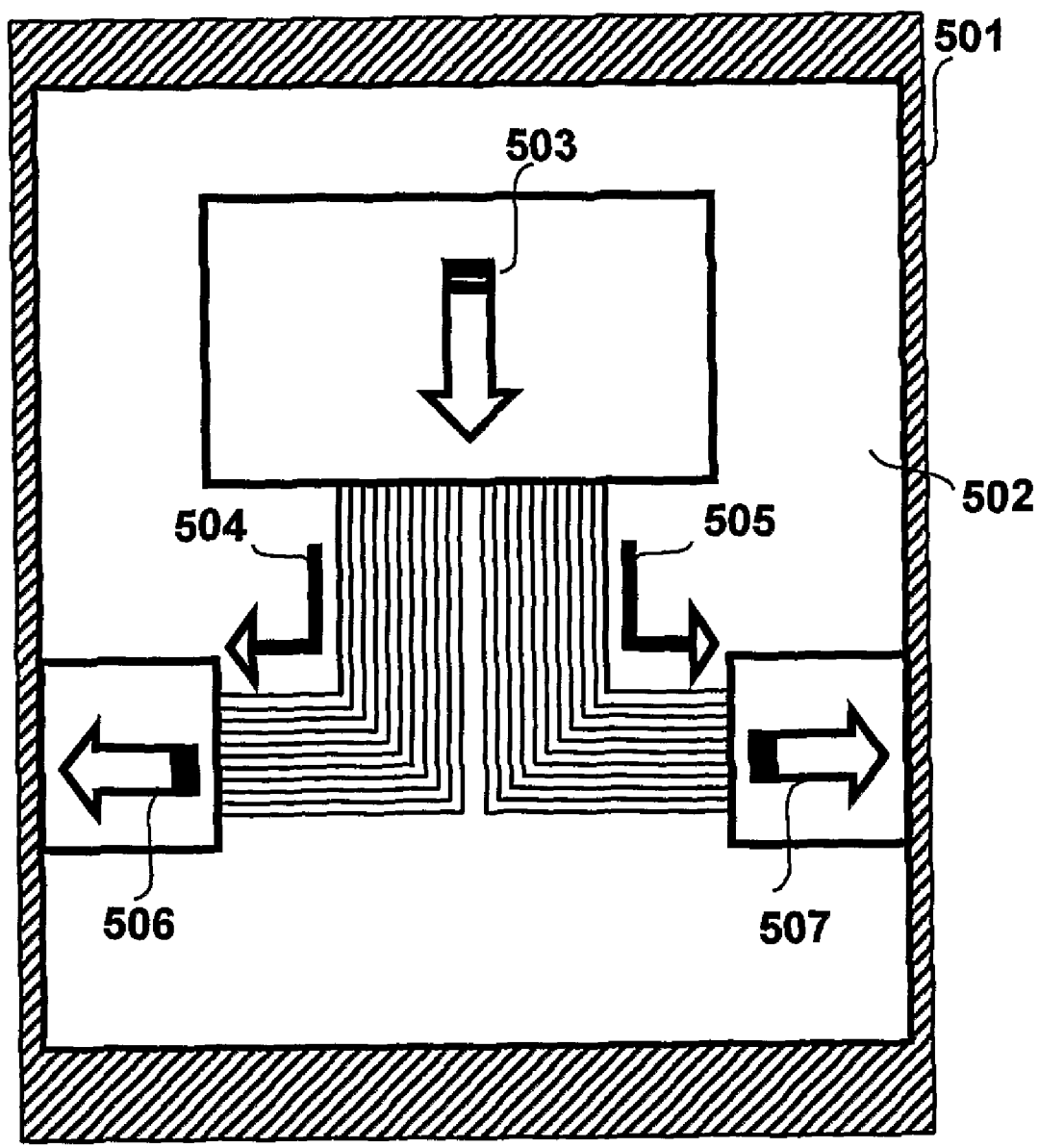
FIG. 5, is a top view illustration of one embodiment of an elastomeric apparatus in conformal contact with a substrate, containing micrometer and submicrometer channels, carrying a fluid.

Sylgard 184 (Dow Corning, UK), a two component silicone rubber (poly(dimethylsiloxane), PDMS), is used to prepare elastomeric device from the micro-nano SU-8 template, that is depicted in FIG. 3. and FIG. 5.

The prepolymer and the curing agent are mixed according to the instructions provided by the manufacturer. This is then poured on the SU-8 template and curing is accomplished by heating up to 130° C. for at least 20 min, but lower temperatures and longer incubation times can also be used depending requirements of stamp softness. Other stamp materials can also be used in the patterning step. The stamp is removed from the template after curing, and an inverted relief structure of the template is created in the elastomeric device.

FIG. 1 illustrates schematically an elastomer device that is molded from the SU-8 template.

Example 2

One Step Contact Printing

Using of elastomeric device for one step contact printing of nano structures that are separated by micrometers. This would not be possible without using the present invention since the micro space between the nano structures would sag.

Example 3

Dye Lasers

Formation of channel structures for micro and nano fluidics, in which liquids that carry luminescent molecules and polymers, are distributed through the channels under steady flow conditions. Such structures may include micro patterned dye lasers, in which the dye solution is distributed into a micro patterned optical cavity, and constantly replenished with fresh solution as the dye is consumed under operation. Distributed Bragg reflectors would be implemented in the same mask, through nanostructures, which could operate on the reflection at an air/template or solution/template interface. Periodic submicron structures could also be used for in coupling and out coupling of light from an optical waveguide defined with the help of liquid in the channel.

Example 4

Electrical Micro to Nano Addressing

The described invention can be used to create connected micro and nano channels in an elastomeric device, in for example PDMS hPDMS or other suitable elastomeric materials. The channels can then be filled with liquid conductive polymers such as PEDOT:PSS (E.g. Baytron from Bayer AG), using the soft lithography technique "molding in capillary". The result is connected super-micro to sub-micrometer conductive polymer wires as illustrated in FIG. 4. The micro dimension wires are optically and mechanically accessible, and the nano wires can thus be controlled and addressed through the micro wires. The electrical nano addressing can be used in purely electrical applications such as in the construction of nano multiplexers. Connected micro-nano wires can also be used for wiring into biological systems. This can be of relevance in applications such as nerve fiber contacting.

Here dimensions of the nanowires should be designed to match the size and geometry of the primary nerve fiber (typically 100 nm). In a way similar to sieve electrodes, these nanowires could be used to make the direct electrical connection to a small collection of the 10-100,000 found in a bundle of nerve fibers normally named a nerve. By building these structures on flexible substrates it is possible to make a Swiss roll architecture to wire with a larger electrode density.

Example 5

Alignment in Multi Step Soft Lithography

Supermicrometer structures with large depths—such as cylinders—are constructed as reliefs in an elastomeric stamp. The stamp simultaneously contains micron or submicron relief's that are not connected to the deep supermicrometer structures. The deep structures can then be aligned against a substrate containing the inverse of the deep structures.

The inverse of the supermicrometer structures is constructed on a substrate using soft lithography with the same shadow mask as the one used to create the supermicrometer structures on the stamp template, according to a further aspect of the invention. The deep supermicrometer relief can accurately fit the inverse structure on the substrate allowing alignment of the elastomer. The alignment procedure can be used in multi step SL patterning, where one or several stamps can be used to print/deposit aligned multilayer structures.

Example 6

A Molecular Separation Device

An elastomeric stamp containing a relief structure is placed on a substrate according a further aspect of the present invention. The sample solution is introduced to the separation device in an elastomeric material at the supermicrometer domain, the actual separation of the molecules then takes place in the sub-micrometer part of the stamp. Separation of molecules, biomolecules, such as DNA, proteins, peptides, is important for numerous applications in biotechnology and medicine. Efforts to improve separation efficiency in microdevices have led to advances in capillary electrophoresis, pillar based separation and other separation strategies. Current research on microcapillary materials is focused on the development of separation matrices with low injection viscosities and wall-coating capabilities. By using the present invention the microcapillary injector geometries in larger channels with sub-micrometer dimensions are connected to the separation area in the sub-micrometer regime can be constructed in elastomeric materials. These can be designed to allow increased control of sample plug volumes. Novel separation strategies using entropic traps, arrays of pillars and Brownian ratchets are also being developed.

Example 7

Nanofluidics Transport of Liquids and Particles (i.e. Macromolecules) in Elastomeric Materials The transport of liquids and particles (i.e. macromolecules) in nanometer sized pores in elastomeric materials is of great interest. Beforehand a liquid containing nominally 50-nm-diameter fluorescent nanoparticles has been transported in carbon nanotubes [Byong M. Kim, Qian S., and Bau H. H., 2005, Filling Carbon Nanotubes with Particles, Nano Letters, 5(5), 873-878.]. There are many obvious disadvantages with the method of using carbon nanotubes as nanochannels instead of the method of elastomeric stamps according to the present invention. The carbon nanotubes have to be placed in contact with the liquid drop, but by using the method of integrated nano-/microchannels in elastomeric materials these can be constructed in the same material. Other advantages with the present invention are that the system can be placed on almost any substrate, functions including liquid transportation and liquid analysis is feasible integrated. Since there exist many transparent elastomers it is possible to observe the system with optical and fluorescence microscopy. Passive filling process can be used if wanted and is possible due to the combined action of capillary forces and evaporation.

An elastomeric device containing a relief structure is placed on a substrate according a further aspect of the present invention. By using conventional micro-/nanomachining combined with soft lithographical methods various already known sensors and detectors is incorporated in the substrate. The elastomeric device is then aligned on top of these detectors and sensors by the proper method. Sample liquids and particles (i.e. macromolecules) are transported by the proper methods including, electroosmotic pumping, syringe pumping, pneumatic valves, hydrodynamic pumping and more. These solutions, with or without particles, is stored and transported in supermicrometer domain; the actual alignment of the macromolecules or particles can then take place in the submicrometer part of the stamp 103. The elastomeric device can be integrated in a total system, i.e. an instrument, containing all functions needed including temperature control, liquid handling and waste, data analysis and presentation.

Example 8

Micro- and Nanofluidics for Labs-on-a-Chip and Labs-in-a-Cell Devices

Labs-on-a-chip are miniaturized systems allowing performing all sorts of physico-chemical analyses directly on the chip. The realization of Labs-on-a-Chip systems in elastomeric materials is for a large part based upon microfabrication techniques enabling microfluidic structures. But the incorporation of nanometer sized parts in combination with micrometer sized parts within the same piece of elastomeric material is first disclosed with the present invention. The system disclosed here allows the control of fluid flows in channels several tens of microns wide combined with miniaturized separation in nanochannels, with integrated detectors. This allows the construction of microsystems such as microneedle arrays, miniaturized systems for ppb pollutant detection, chips for lithium analysis in blood samples, miniaturized NMR chips and chips for hydrodynamic separations (HDC chips). Further downscaling of Labs-on-a-chip available today to the area of nanofluidics (typical dimension <100 nm) opens up the way to develop tools to use a single cell as experimentation platform, a so-called Lab-in-a-Cell (LIC). This is preferably done in the same piece of elastomeric material which allows both macro sized storage, with micro sized liquid transportation and nanometer sized areas for cell analysis all massive parallel if wanted. LIC systems typically involves sub-micrometer sized parts such as nanochannels, nanopipettes and sub-micron pores. The present invention allows realization of these in the same material, a concept enabling cell-experimentation on-chip. Future possibilities to use chip formats to evaluate drugs supplied on the single cell level is possible using such systems. But it would also be possible to sample substances excreted by the cell which is then transported away in the nanochannels and analyzed further downstream by using mass spectroscopy. Complex proteins samples can be analyzed in a Polydimethylsiloxane (PDMS) microdevice, a possible solution is the integration of two functions: an electrophoretic protein separation stage coupled to a microreactor for enzymatic digestion. Transportation of liquids is performed by the way of integrated pneumatic valves and separation of substances can be done in a nanopore area. Digested and separated solutions are eluted from the device and analyzed via MALDI-TOF spectrometry. Total analysis time lasts around twenty minutes without having to use sample pretreatment, including surface conditioning of the device. This type of device is best fabricated using multi-layer soft lithography technology in order to combine electro-osmotic pumping with mechanical trapping and pumping. However, the main system is designed within the same PDMS slab.

An elastomeric stamp containing a relief structure is placed on a substrate according to a further aspect of the present invention. By using conventional micro-/nanomachining combined with soft lithographical methods various already known sensors and detectors is incorporated in the substrate. The elastomeric device is then aligned on top of these detectors and sensors by the proper method. Sample solutions are transported by the proper methods including, electroosmotic pumping, syringe pumping, pneumatic valves, hydrodynamic pumping and more. Sample solutions, cell media and other proper solutions can be stored and transported in super-micrometer domain; the actual analysis of the molecules or cells can then take place in the sub-micrometer part of the stamp. The elastomeric device can be integrated in a total system, i.e. an instrument, containing all functions needed including temperature control, liquid handling and waste, data analysis and presentation.

The invention claimed is:

1. An elastomeric device comprising a body of an elastomeric material, said body having at least one, flat or curved, surface provided with at least one nanoscale indentation extending into said at least one surface and at least one microscale indentation extending into said at least one surface, wherein
    each indentation extends a depth from a base line being a line where said surface intersects said indentation and wherein each indentation has at the base line a width,
    an aspect ratio a for each indentation is defined as the depth of that indentation divided by the width of that indentation;
    $a_{low}$ is the aspect ratio where sagging of an indentation occurs for the elastomeric material,
    $a_{high}$ is the aspect ratio where collapse of an indentation occurs for the elastomeric material,
    the nanoscale indentation has a first depth and a first width defining a first aspect ratio, the first width being less than 1 micrometer, the first aspect ratio being between $a_{low}$ and $a_{high}$, and
    the microscale indentation has a second depth and a second width defining a second aspect ratio, the second depth being different than the first depth, the second width being greater than 1 micrometer, the second aspect ratio being between $a_{low}$ and $a_{high}$.

2. The elastomeric device according to claim 1, wherein the nanoscale indentation and the microscale indentation are connected.

3. The elastomeric device according to claim 1, wherein the nanoscale indentation and the microscale indentation are separated from one another.

4. A method of manufacturing an elastomeric device, the method comprising:
    selecting a curable elastomeric compound;
    determining an aspect ratio $a_{low}$ and an aspect ratio $a_{high}$ for the elastomeric compound when cured, $a_{low}$ being the ratio of depth to width of an indentation where sagging occurs for the elastomeric material when cured, $a_{high}$ being the ratio of depth to width where collapse of an indentation occurs for the elastomeric material when cured;
    forming a template including at least one nanoscale protrusion and at least one microscale protrusion, the nanoscale protrusion having a first height and a first width and defining a first aspect ratio, the first width being less than 1 micrometer, the first aspect ratio being between $a_{low}$ and $a_{high}$, the microscale protrusion having a second height and a second width and defining a second aspect ratio, the second height being different than the first height, the second width being greater than 1 micrometer, the second aspect ratio being between $a_{low}$ and $a_{high}$;
    providing the curable elastomeric compound on the template; and
    curing the elastomeric compound so as to form the elastomeric device having at least one surface with nanoscale and microscale indentations having inverse configurations relative to the nanoscale and microscale protrusions, respectively.

5. The method according to claim 4, wherein the nanoscale protrusion is formed in a first process and the microscale protrusion is formed in a second and separate process.

6. The method according to claim 5, wherein the first process is selected from the group consisting of:
    electron beam lithography, DUV/EUV photolithography, ion beam patterning, soft UV-nano imprint lithography, nano imprint lithography, soft lithography, self assembly patterning, and colloidal crystal patterning.

7. The method according to claim 5, wherein the second process is a photo lithographical technique.

8. The method according to claim 4, wherein forming the template comprises:

imprinting a submicrometer structure master in a curable resist, curing said resist to form the nanoscale protrusion, depositing on top of the nanoscale protrusion a homogeneously thick layer of the same curable resist, and generating the microscale protrusion in said deposited curable resist through contact photo lithography patterning.

9. The method according to claim 8, wherein the curable resist is a thermally and/or UV curable resist.

10. The method according to claim 4, further comprising:

providing a substrate having a face for receiving said elastomeric device, wherein said at least one surface with nanoscale and microscale indentations is brought into conformal contact with said face of the substrate.

11. The method according to claim 10, further including the steps of:

arranging aligned pre-positioned structures on said face of said substrate, and aligning at least a part of said microscale indentation with said pre-positioned structures to enable positioning of said nanoscale indentation on said substrate.

12. The method of claim 10, whereby the indentations and said face of said substrate cooperate to form channels.

13. The method according to claim 12, wherein said channels are configured for use in one of: a fluidic network, a gaseous network, or a vacuum network.

* * * * *